May 21, 1974 J. G. VAN LIEROP ET AL 3,811,975

METHOD OF MANUFACTURING A SEMICONDUCTOR DEVICE AND DEVICE MANUFACTURED BY THE METHOD

Filed Dec. 16, 1971 3 Sheets-Sheet 1

INVENTOR.
JOSEPH G. VAN LIEROP
BY

AGENT

INVENTOR.
JOSEPH G. VAN LIEROP
BY
Frank R. Trifari
AGENT

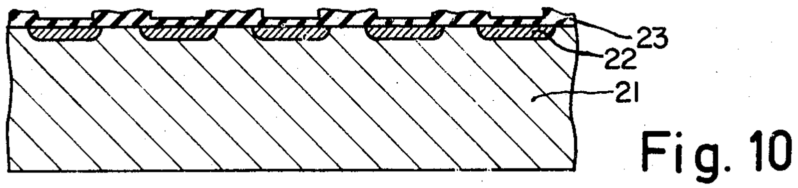
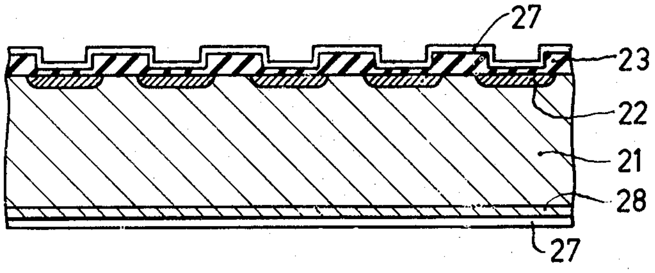
Fig. 11
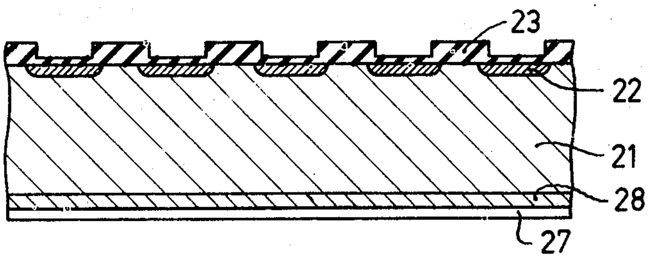
Fig. 12
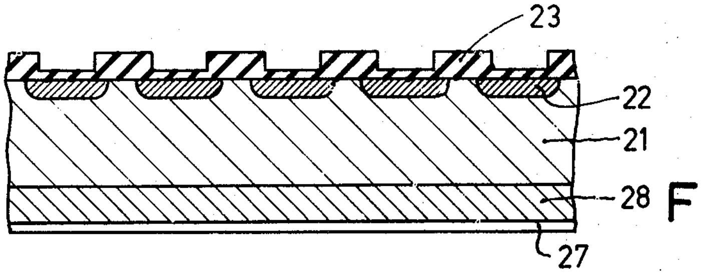
Fig. 13
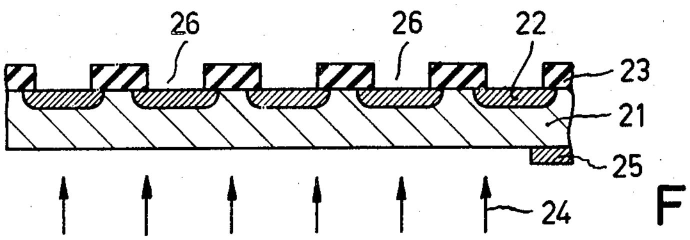
Fig. 14
*INVENTOR.*
JOSEPH G. VAN LIEROP
*BY*
AGENT

United States Patent Office

3,811,975

Patented May 21, 1974

3,811,975

METHOD OF MANUFACTURING A SEMICONDUCTOR DEVICE AND DEVICE MANUFACTURED BY THE METHOD

Joseph Gijsbertus van Lierop, Emmasingel, Eindhoven, Netherlands, assignor to U.S. Philips Corporation, New York, N.Y.

Filed Dec. 16, 1971, Ser. No. 208,706

Claims priority, application Netherlands, Jan. 8, 1971, 7100275

Int. Cl. H01l 7/50

U.S. Cl. 156—13 7 Claims

ABSTRACT OF THE DISCLOSURE

A method of gettering a semiconductor device having an insulating layer of which at least a part must not be covered with a gettering material, for example with phosphorsilicate glass, at the gettering temperature. According to the invention, the gettering material is provided on the whole semiconductor body and on the insulating layer at such a low temperature that substantially no gettering occurs, and the gettering material is then removed from at least a part of the insulating layer, after which the gettering step is carried out as the last treatment carried out at high temperature. Application in particular in gettering MOS transistors.

Figure 1:
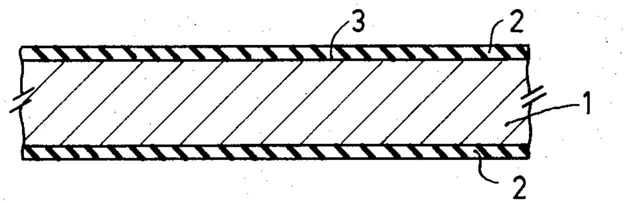
Figure 2:
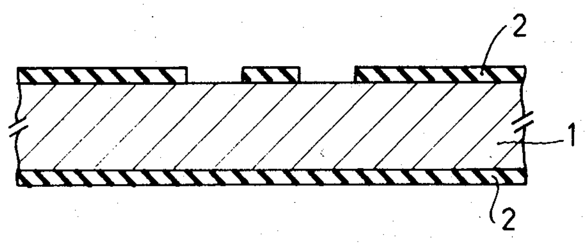

The invention relates to a method of manufacturing a semiconductor device comprising a semiconductor body a surface of which is at least partly covered with an insulating layer in which, after providing the insulating layer, a layer of a gettering material is provided on the whole semiconductor surface and on the insulating layer, a thermal treatment being then carried out to remove undesirable impurities from the semiconductor body and from the insulating layer.

The invention furthermore relates to a semiconductor device manufactured by using the method.

Methods as described above for removing impurities, sometimes termed gettering methods, are known and are frequently used in semiconductor technology to improve the electric properties of the device. The improvement of said properties may be of various natures; in particular, an improvement of the current-voltage characteristic (high breakdown voltage, "hard" characteristics, low leakage current) of the *p-n* junctions present, and also often an increase of the life of minority charge carriers in the semiconductor body or in parts thereof can be achieved by using such a gettering method.

The impurities to be removed are mainly atoms or ions of metals, in particular of heavy metals (Au, Cu) in the semiconductor body, and ions of alkali metals, for example sodium, which give rise to instabilities in the insulating layer, for example in silicon oxide.

In a method as described in which the gettering material is provided on the whole semiconductor body and on the insulating layer, a glass layer is often used which during and also after the gettering step remains on the body and on the insulating layer. Such a layer of, for example, phosphorsilicate glass on the insulating layer can be advantageous in many cases, for example, in monolithic bipolar circuits, and may even exert a favorable stabilizing influence as a passivating layer present on the insulating layer.

In certain cases which also frequently occur, however, such a method cannot be used. This is the case in particular upon manufacturing devices in which at least a part of the insulating layer is to be very thin, for example, the insulating layer of insulated gate field effect transistors present below the gate electrode. As a result of the presence of a comparatively thick gettering layer on said insulating layer, the threshold voltage, the stability and the steepness of the field effect transistor can be adversely influenced.

In order to achieve in such devices the ultimately desired thickness of the insulating layer, the insulating layer covered with gettering material could be etched away partly after the gettering step. However, it has proved practically impossible to do this in a reproducible manner.

Another drawback is that upon gettering with a gettering layer on the insulating layer, and then etching away the gettering layer, holes are easily formed in the remaining insulating layer. This is the case in particular when the insulating layer consists of silicon oxide or silicon nitride and a gettering layer of phosphorsilicate glass is used. The probable cause hereof is that during the gettering process gettering material locally penetrates into the insulating layer and that the regions of the insulating layer thus doped are attacked much more quickly by the etchant than the remaining parts of the insulating layer.

The said drawbacks could be avoided, for example, by providing the gettering material not on the insulating layer but locally on other parts of the body in the form of a paste. Such methods are known but they suffer from the drawback of being rather complicated and the possibility that some gettering material nevertheless reaches the insulating layer prior to or during the gettering process is rather great.

One of the objects of the invention is to provide a method in which the gettering material can be provided, preferably from the vapor phase, on the whole body and in which the above-mentioned drawbacks are nevertheless avoided or at least considerably reduced.

The invention is *inter alia* based on the recognition of the fact that by providing the gettering material at low temperature in the desirable places and carrying out gettering only as a last treatment at high temperature, an effective gettering step can also be used in manufacturing devices having very thin insulating layers without the reproducibility and the stability of the device being adversely influenced.

A method of the type mentioned in the preamble is therefore characterized according to the invention in that the gettering material is provided at such a low temperature that substantially no gettering action occurs, that the gettering material is then removed from at least a part of the insulating layer, and that the said impurities are removed during a gettering step by a thermal treatment at high temperature in the presence of the remaining gettering material, said thermal treatment being succeeded only by treatments at temperatures lower than that at which the said gettering action occurs significantly.

Since the gettering material is provided at a low temperature, it does substantially not penetrate into the insulating layer so that the above described instabilities which occur *inter alia* as a result of perforation of the insulating layer are avoided. As a result of this, it is also possible to very effectively getter devices having very thin oxide layers, in which (as for example, in the conventional gettering methods for bipolar monolithic circuits) the gettering step is carried out as a last treatment performed at high temperature so that subsequent treatments introduce substantially no further impurities into the semiconductor body.

Furthermore, the method according to the invention may advantageously be combined with known methods according to which the emitter zones of bipolar transistors present in a monolithic circuit are provided simultaneously with the gettering step. For that purpose, the gettering layer is removed only from those parts of the insulating layer which may not contact gettering material at high temperature, for example, at the area of the gate electrode of insulated gate field effect transistors belonging to the circuit, while the gettering layer remains at the area of the said emitter zones to be formed and forms the emitter zones during the gettering step by diffusion.

According to an important preferred embodiment, the gettering layer is a layer of glass having a composition which differs from that of the insulating layer, said glass layer being removed by selective etching. This can advantageously be carried out by etching with an etchant which attacks the layer of glass considerably more rapidly than the insulating layer. Of particular importance is a preferred embodiment in which a gettering layer of phosphorsilicate glass is provided on an insulating layer which consists at least at its surface of silicon oxide, a solution containing hydrofluoric acid being used for etching. By means of such an etchant, the phosphorsilicate glass layer is etched very much more quickly than the silicon oxide so that the selective etching away of the gettering layer can be carried out in a simple and reproducible manner.

The method according to the invention is also particularly suitable for combination of the gettering treatment with a passivating treatment of the insulating layer. For example, according to a further preferred embodiment a passivating material (for example, silicon nitride) is provided on the insulating layer prior to or during the gettering step after removing the gettering material from the insulating layer. When a phosphorsilicate glass is used as a gettering material and the insulating layer consists at least at its surface of silicon oxide, a phosphorsilicate glass having a lower phosphorus content than the gettering layer may also advantageously be provided, prior to the gettering step, as a passivating material at a temperature which is lower than the gettering temperature. As a result of this a single phosphorus source which is used at various temperatures is sufficient, while the passivation is carried out simultaneously with the gettering step, which is time-saving.

The invention furthermore relates to a semiconductor device manufactured by using the method described.

In order that the invention may be readily carried into effect, a few embodiments thereof will now be described in greater detail, by way of example, with reference to the accompanying drawings, in which FIGS. 1 to 9 are diagrammatic cross-sectional views of a semiconductor device in successive stages of manufacture according to the invention, and FIGS. 10 to 14 are diagrammatic cross-sectional views of another semiconductor device in successive stages of manufacture according to the invention.

The figures are diagrammatic and not drawn to scale. Corresponding components are generally referred to by the same reference numerals in the drawings.

FIGS. 1 to 9 are diagrammatic cross-sectional views of a semiconductor device in successive stages of manufacture by using the method according to the invention.

The semiconductor device in this embodiment (see FIG. 9) consists of a plate-shaped semiconductor body of silicon which comprises an insulated gate field effect transistor. In addition to this field effect transistor, the silicon plate 1 of which only a part is shown in a cross-sectional view, may comprise other circuit elements which, together with the said field effect transistor, may form a monolithic integrated circuit.

The field effect transistor comprises a *p*-type substrate region 1, resistivity 3.3 ohm.cm., in which *n*-type source and drain zones 4 and 5 are provided. The surface 3 of the silicon plate is covered with an insulating silicon oxide layer (2, 6). An aluminium gate electrode 12 is provided on the part 6 of the oxide layer which has a thickness of 0.13 micron. The source and drain zones 4, 5 are connected to aluminium layers 10 and 11 *via* contact windows in the oxide layer 2.

In the oxide layer 6 and/or in the semiconductor body of the field effect transistor described, impurities can be introduced, in the silicon often heavy metal ions, for example Au and Cu, and in the oxide layer, for example sodium ions, which, moreover, can move under the influence of the electric fields occurring in the operating condition. As a result of this, the electric stability and other electric properties, for example the leakage current (dark current) and the breakdown voltage between the source and drain zones 4 and 5 and the substrate region 1, can adversely be influenced. The term dark current in this application is commonly understood to mean the current through a diode in the reverse direction in the absence of incident radiation. As a result of the low thickness and other requirements to be imposed on the oxide layer 6, said layer cannot be exposed, for removal of the said impurities, to a gettering diffusion at high temperature, as is advantageously used, for example, in bipolar transistor structures.

Figure 9:
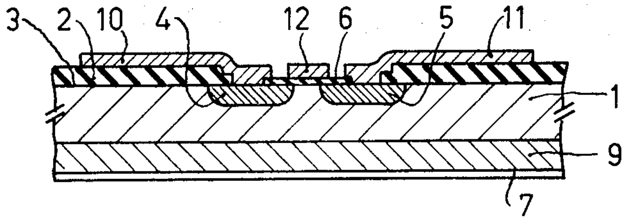

Therefore, the device shown in FIG. 9 is manufactured as follows according to the invention: Starting material (FIG. 1) is a *p*-type silicon plate 1, orientation (100), resistivity 3.3 ohm.cm., thickness 200 microns, a surface 3 of which is prepared in the usual manner by etching and polishing, while the oppositely located surface of the plate is scoured. A layer 2 of silicon oxide, see FIG. 1 is provided on the whole surface of the plate 1 by thermal oxidation at 1000° C. in moist oxygen for 45 minutes. By using known photolithographic etching methods, apertures are provided on the side of the surface 3 in the oxide layer 2 at the area of the source and drain zones to be provided, see FIG. 2.

Figure 3:
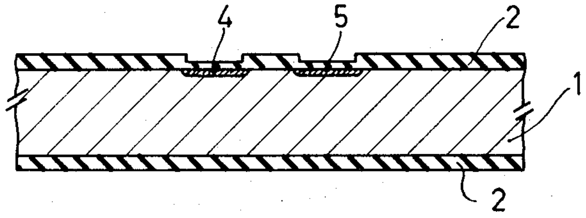
Figure 4:
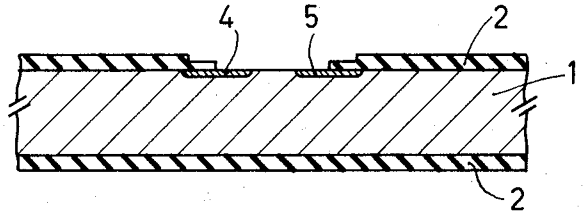

*Via* said apertures, phosphorus is then indiffused in the usual manner with a surface concentration of $10^{20}$ atoms/ccm. while using $POCl_3$ as a diffusion source. The *n*-type source and drain zones 4 and 5 are formed (FIG. 3).

Figure 5:
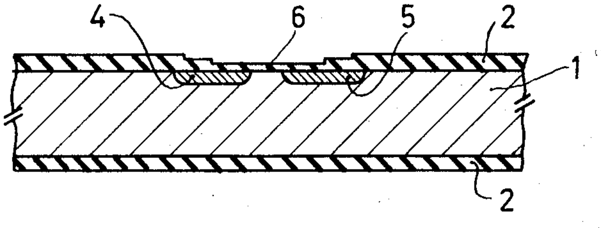
Figure 6:
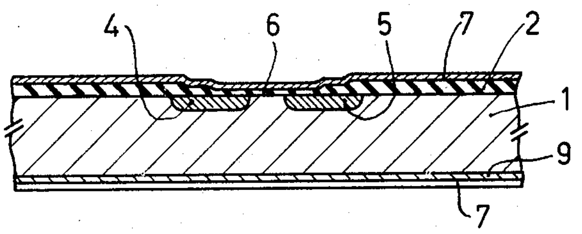
Figure 7:
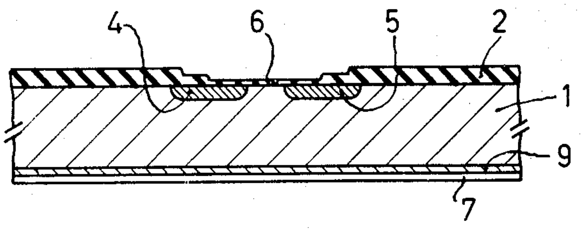
Figure 8:
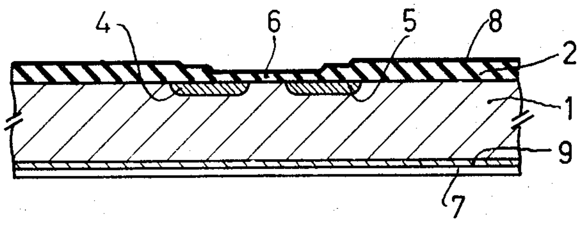

At the area of the gate electrode to be formed, the oxide layer 2 is then removed (see FIG. 4) by masking and etching and an oxide layer 6, thickness 0.2 micron, see FIG. 5, is obtained by thermal oxidation at 1000° C. for 20 minutes in moist nitrogen. This layer is slightly thicker than the ultimately desired thickness (0.13 micron) of the oxide below the gate electrode.

The oxide 2 is then removed on the lower side of the silicon plate. According to the invention gettering material in the form of a phosphorsilicate glass layer 7 is then provided on the whole semiconductor body and on the oxide layer by a phosphorus diffusion with a high surface concentration of $10^{21}$ atoms/ccm. carried out at 975° C. for 12 minutes, see FIG. 6, a thin *n*-type layer 9 being formed in the lower side of the plate by diffusion. Substantially no gettering action occurs at this low temperature.

The thin layer 7 of phosphorsilicate glass which, at the temperature used, has penetrated into the oxide layer 6 through approximately 0.07 micron is then removed from the phosphorus-free oxide layer (2, 6) (see FIG. 7) by etching in a solution of 10 ccm. HF 50%, 15 ccm. $HNO_3$ 65% and 300 ccm. $H_2O$ for approximately 10 seconds at room temperature. The lower side of the silicon plate is masked during said etching treatment.

The said etching liquid etches the phosphorsilicate glass 7 considerably more rapidly (0.03 micron/sec.) than the underlying phosphorus-free oxide (2, 6). As a result of this the etching time is not very critical since upon reaching the phosphorus-free oxide the etching rate falls to a very low value ($3$–$6.10^{-4}$ microns/sec.). In this manner the desirable thickness of the oxide layer 6 can be determined with a great reproducibility.

In order to electrically stabilize the oxide layer below the gate electrode, a phosphorus diffusion with a low surface concentration ($10^{18}$ atoms/ccm.) is then carried out at a temperature of 975° C. for 10 minutes in $$N_2+O_2+POCl_3$$

To remove the above-mentioned impurities a gettering step is then carried out as a last treatment at high temperature by heating the silicon plate at 1050° C. for 10 minutes. During this gettering step, the phosphorus 8 provided with a low concentration and at low temperature also diffuses into the oxide layer 6 to stabilize said oxide layer, while from the gettering phosphorsilicate glass layer 7 an *n*-type layer 9 is formed in the plate on the lower side of the plate by diffusion (said layer should be removed when the *p*-type region 1 on the lower side is to be contacted).

Finally, windows are etched in the conventional manner in the oxide layer (2, 6) and the gate electrode 12 and the source and drain contact layers 10 and 11 are provided while using known vapor deposition and masking methods.

An insulated gate field effect transistor can be obtained in the manner described the properties of which are considerably improved by a gettering step in spite of the fact that the thin insulating layer present below the gate electrode makes the use of the gettering step which is usual in other structures, with a gettering layer present on the whole body, impossible.

In order to illustrate the resulting improvement in properties as compared with MOS transistors in which no gettering step was used, it is to be noted that for an *npn*-transistor as described above at a source and gate voltage 0 and a drain voltage of +10 volt a leakage current of $10^{-9}$–$10^{-8}$ ampere/sq. cm. was measured from source to drain. With an identical transistor on which no gettering step has been used the leakage current under the same circumstances was more than $10^{-7}$ ampere/sq. cm.

For a *pnp*-transistor, so with opposite polarity relative to the transistor described but with the same dimensions and gate oxide thickness, the leakage current without gettering step at a drain voltage of −10 volt was more than $10^{-6}$ ampere/sq. cm. and when using the gettering step described it was $10^{-9}$–$10^{-8}$ ampere/sq. cm.

Of course the method according to the invention is not restricted to the use of phosphorsilicate glass as a gettering material. For example, borosilicate glass or other materials may also be used. Furthermore, the insulating layer may consist of materials other than silicon oxide, for example silicon nitride or aluminium oxide. Furthermore, the insulating layer may also consist of layers situated one on top of the other and composed of different materials and the semiconductor body may consist of semiconductor materials other than silicon, for example, germanium or $A_{III}B_V$-compounds. Furthermore, in addition to phosphorus as a passivating material, another material, for example silicon nitride, may also be used which, if desirable, may be provided prior to, during or after the gettering step.

In order to illustrate the fact that the method according to the invention is not restricted to the manufacture of devices having an insulated gate field effect transistor but may also advantageously be used in other semiconductor devices, an example will now be given of the use of the invention in the manufacture of a target of a camera tube for converting electro-magnetic picture signals into electric signals. Such a target consists, for example (see FIG. 14) of an *n*-type silicon plate 21 in which a number of *p*-type zones 22 are provided which form *p-n* junctions with the *n*-type material 21. On the side of the diodes 21 the plate is covered with an insulating layer 23 of, for example, silicon oxide in which apertures 26 are provided at the area of the zones 22. When light is incident in the direction of the arrows 24 on the lower side of the plate which is provided with an ohmic contact 25, the diodes 22 are charged by the generated charge carriers to a level which is determined by the local radiation intensity, after which the other side of the plate is scanned by an electron beam which neutralizes the diodes 22. The flow of electrons of the beam which is dissipated *via* contact 25 depends upon the extent to which the relevant diode was charged so that variations of the radiation intensity are converted into current variations of the electron beam.

Upon manufacturing such a target it is highly desirable to use a gettering process in order to obtain diodes having a leakage current (dark current) which is as small as possible.

The conventional gettering with a thick phosphorsilicate glass layer, however, meets with objections in this case. The presence of such a thick glass layer on the oxide layer 23 necessitates the use of an etching mask for etching the apertures 26 and, as already described above, the possibility of the formation of holes in the oxide layer upon using such a gettering method is also great.

Therefore, according to the invention the target shown in FIG. 14 is manufactured as follows. On a (111)-oriented plate 21 of *n*-type silicon, thickness 200 microns, resistivity 5 ohm. cm., an oxide layer 23 is thermally provided in the usual manner and apertures are etched in it. *Via* said apertures, boron is indiffused to form the *p*-type zones 22, after which the oxide is removed on the lower side so that the structure shown in FIG. 10 is obtained. A layer of phosphorsilicate glass 27 is then provided on the whole body, analogous to the preceding example, at a temperature of 975° C. and with a surface concentration of $10^{21}$ atoms/ccm. A thin highly doped *n*-type layer 28 see FIG. 11, is then obtained on the lower side of the plate.

The gettering layer 27 is then removed from the upper side of the plate (see FIG. 12) in the same manner as described in the preceding example. The plate is then (see FIG. 13) subjected to a gettering treatment at high temperature (1050° C.), the phosphorus indiffusing from the layer 27 and exerting a gettering effect as a result of which the diodes 22 obtain a reproducible high breakdown voltage and a very low leakage current. The thickness of the layer 28 further increases during said diffusion.

For providing the windows 26 (see FIG. 14) no extra mask is necessary in this case. The thin oxide layer present on the zones 22 is removed by a short etching treatment in a buffered HF solution, an oxide layer of sufficient thickness remaining between the diodes 22.

The plate is finally etched on the lower side down to an overall thickness of 30 microns, so that substantially all the charge carriers generated by the radiation 24 can reach the diodes 22. After providing the contact 25 which preferably is an annular contact provided along the edge of the plate, the target can be mounted in a camera tube.

In manufacturing this target, the materials of this insulating layer 23, of the gettering layer 27 and of the semiconductor body may be varied at will by those skilled in the art as described in the preceding example. When using a scanning beam having positive charge carriers instead of the electron beam, the zones 22 may also be *n*-type conductive, while the plate 21 is *p*-type conductive in that case. It will furthermore be obvious that the method according to the invention may be used, if desirable, in manufacturing many other semiconductor devices. It will furthermore be obvious that many variations are possible to those skilled in the art without departing from the scope of the present invention. For example, particularly the gettering layer may be removed, prior to carrying out the gettering step in the examples described, instead of from the whole upper surface 3 of the semiconductor plate only from a part of said upper surface of the underlying insulating layer, for example, in manufacturing a MOS transistor only from the gate electrode oxide.

What is claimed is:

1. A method of manufacturing a semiconductor device comprising a succession the steps of (a) providing a structure comprising both a semiconductor body and an electrically insulating layer covering at least part of a surface of said body, gettering action being desired at a first surface portion of said insulating layer and undesired at a second surface portion thereof;

(b) providing a layer of gettering material on the entire surface area of said structure, said gettering material being characterized by providing gettering action substantially only above a certain temperature, said layer being provided at a temperature below said certain temperature, so that substantially no gettering action occurs during provision of said layer;

(c) removing said gettering layer from at least said second surface portion of said insulating layer;

(d) heating said structure and remaining portions of said gettering layer at a first temperature above said certain temperature, so as to getter undesired impurities from said structure, said first temperature further, exceeding subsequently employed processing temperatures and said subsequently employed processing temperatures being below said certain temperature.

2. A method as recited in claim 1, wherein said gettering layer consists of glass having a composition different from that of said insulating layer, said glass layer being removed from said second portions of said insulating layer by selective etching.

3. A method as recited in claim 2, wherein said glass layer is selectively removed by etching with an etchant which preferentially attacks the glass layer material with respect to said insulating layer material.

4. A method as recited in claim 2, wherein said gettering layer consists essentially of a first phosphorsilicate glass and at least the surface region of said insulating layer consists essentially of silicon oxide, said etchant comprising hydrofluoric acid.

5. A method as recited in claim 1, further comprising the step of providing a passivating layer on said insulating layer at a time not succeeding said gettering step but after removing said gettering material from said second portion of insulating layer.

6. A method as recited in claim 5, wherein said passivating layer comprises a second phosphorsilicate glass having a significantly lower phosphorus content than said first phosphorsilicate glass of said gettering layer, said passivating layer being provided prior to said gettering step and at a temperature below said certain temperature.

7. A method as recited in claim 1, wherein said semiconductor device comprises an insulating gate field effect transistor comprising a gate electrode, and said second surface portion comprises the part of said insulating layer provided at which part of said gate electrode is provided.

References Cited

UNITED STATES PATENTS

| | | | |
|---|---|---|---|
| 3,529,347 | 9/1970 | Ingless et al. | 29—571 |
| 3,579,815 | 5/1971 | Gentry | 29—580 |

WILLIAM A. POWELL, Primary Examiner

U.S. Cl. X.R.

29—571; 156—15, 17